United States Patent [19]
Kimura

[11] Patent Number: 5,275,658
[45] Date of Patent: Jan. 4, 1994

[54] LIQUID SUPPLY APPARATUS

[75] Inventor: Yoshio Kimura, Kumamoto, Japan

[73] Assignees: Tokyo Electron Limited, Tokyo; Tokyo Electron Kyushu Limited, Kumamoto, both of Japan

[21] Appl. No.: 988,797

[22] Filed: Dec. 10, 1992

[30] Foreign Application Priority Data

| Dec. 13, 1991 | [JP] | Japan | 3-351191 |
| Dec. 13, 1991 | [JP] | Japan | 3-351192 |
| Dec. 13, 1991 | [JP] | Japan | 3-351193 |

[51] Int. Cl.$^5$ .............................................. B05C 5/00
[52] U.S. Cl. ..................................... 118/302; 118/52; 118/56; 118/321; 118/203; 427/425
[58] Field of Search ............... 118/52, 56, 302, 313, 118/321, 411, 600, 203, 204, 401; 427/422, 425, 426; 239/114, 115, 123

[56] References Cited

U.S. PATENT DOCUMENTS

| 4,190,015 | 2/1980 | Hillman | 118/321 X |
| 4,886,012 | 12/1989 | Ikeno et al. | 118/52 X |
| 5,002,008 | 3/1991 | Ushijima et al. | 118/52 X |
| 5,089,305 | 2/1992 | Ushijima et al. | 118/52 X |
| 5,116,250 | 5/1992 | Sago et al. | 118/52 |

Primary Examiner—David A. Simmons
Assistant Examiner—James J. Engel, Jr.
Attorney, Agent, or Firm—Oblon, Spivak, McClelland, Maier & Neustadt

[57] ABSTRACT

A developer-supply apparatus has a developer-liquid supply nozzle, a spin chuck for supporting a wafer, and a holder for allowing the supply nozzle to wait there. The supply nozzle is transferred between a position above the chuck and a waiting position on the holder. The supply nozzle has a nozzle tip with a plurality of through holes communicating with a space containing a developer liquid. A U-shaped conduit extending along the line of the through holes is provided in the holder, for removing drops of the developer liquid hanging from the nozzle tip. The conduit has a bottom provided with a plurality of through holes for exhausting the developer liquid.

16 Claims, 13 Drawing Sheets

LIQUID SUPPLY APPARATUS

BACKGROUND OF THE INVENTION

1. Field of the Invention

This invention relates to an apparatus for supplying a treatment liquid, such as a developer liquid, onto a substrate, such as a semiconductor wafer.

2. Description of the Related Art

U.S. Pat. No. 5,002,008 discloses a liquid supply apparatus of this type. In this apparatus, a liquid-supply nozzle is located above a rotatable spin chuck and opposed to a semiconductor wafer placed on the chuck. Drops of the developer liquid are applied onto the semiconductor wafer via through holes formed in the supply nozzle, and then the spin chuck is rotated, thereby spreading the developer liquid all over the wafer.

In the above apparatus, a holder or trench for receiving the supply nozzle when it is in a waiting state is provided at a side of the spin chuck. The holder generally consists of a box-like vessel for holding the supply nozzle with its through holes not sealed.

In the liquid supply apparatus constructed as above, the developer liquid may remain in the through holes when the nozzle is in the waiting state. The remaining liquid may deteriorate and solidify into particles. If the particles stick to the supply nozzle, the nozzle may not apply the developer liquid uniformly onto the wafer, or the particles may stick to the wafer.

To eliminate a developer liquid which degraded, a method for exhausting a predetermined amount of developer liquid from the holder, which is called "dummy dispensation", has been employed. This method, however, cannot eliminate the particles completely, and is not economical since it requires a great amount of developer liquid.

SUMMARY OF THE INVENTION

It is the object of the invention to provide a liquid-supply apparatus in which the amount of particles resulting from solidification of a treatment liquid, which may stick to a liquid-supply nozzle, is small.

A liquid-supply apparatus of the invention comprises:
a table for supporting a substrate to be treated;
a vessel defining a space for containing treatment liquid;
a treatment liquid contained in the space;
a supply nozzle having a nozzle tip with a plurality of through holes communicating with the space and arranged in line;
means for controlling discharge of the treatment liquid through the through holes and stop of the discharge, the treatment liquid forming drops hanging from the nozzle tip when the discharge is stopped;
a holding member provided on one side of the table for allowing the supply nozzle to wait therein;
a removal member for removing the developer liquid in a state in which the supply nozzle is held by the holding member, the removal member having a surface opposed to the nozzle tip along the line of the through holes, the distance between the nozzle tip and the opposed surface being smaller than the length of each drop of the developer liquid; and
transfer means for transferring the supply nozzle between a supply position above the table and a waiting position on the holding member.

In the liquid-supply apparatus of the invention, the treatment-liquid sticking to the nozzle tip can be removed when the supply nozzle is in a waiting state, thereby enabling the treatment liquid to be supplied uniformly in the supply process, and preventing a substrate from being contaminated.

Further, making the supply nozzle wait in the atmosphere of an inactive gas can prevent the treatment liquid from degrading.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
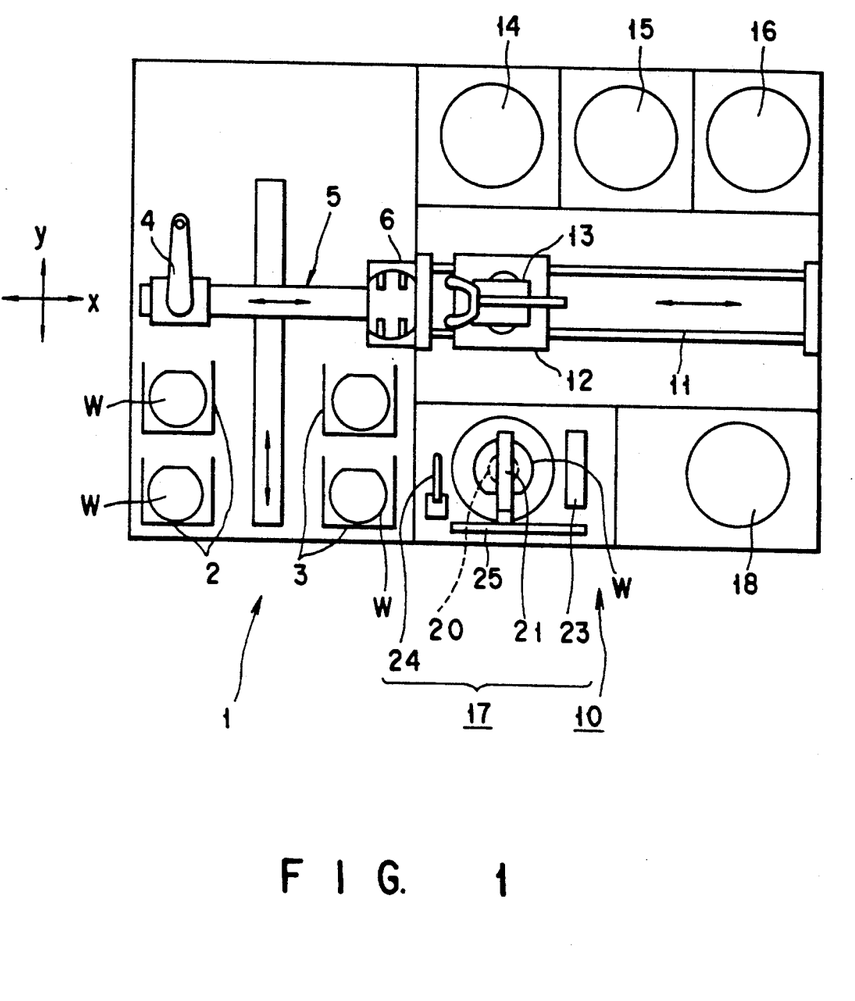
FIG. 1 is a schematic plan view, showing a resist-applicating and developing system according to the invention.

FIG. 1 shows a resist-applicating and developing system incorporating a liquid supply apparatus and according to the invention. This resist-applicating and developing system is provided adjacent to an exposure system (not shown), and has an essential part comprising a treatment unit 10 having treatment devices for treating an object (e.g., a semiconductor wafer W) in various manners, and a transfer unit 1 for automatically transferring the wafer W into and out of the treatment unit 10.

The transfer unit 1 has a wafer carrier 2 for receiving untreated wafers W, a wafer carrier 3 for receiving treated wafers W, an arm 4 for drawing and holding the wafers W, a movement device 5 for moving the arm 4 in X, Y, and Z directions (i.e., in horizontal directions and in a vertical direction) and rotating them in a $\theta$ direction, and an alignment stage 6 for aligning the wafers W and transferring them to and from the treatment unit 10.

The treatment unit 10 has a transfer device 12 movable along a transfer path 11 extending from the alignment stage 6 in the X direction. The transfer device 12 has a main arm 13 movable in the Y, Z, and $\theta$ directions. On one side of the transfer path 11, there are located an adhesion treatment device 14 for performing an adhesion treatment to enhance the adhesiveness of the wafer W and a resist liquid film, a pre-baking device 15 for evaporating by heat a solvent remaining in a resist applied on the wafer W, and a cooling device 16 for cooling the heated wafer W. On the other side of the path 11, there are located a developer device 17 for applying a developer liquid onto the wafer W, and an application device 18 for applying a resist film on the wafer W. The developer device 17 has a holder for holding a retreated nozzle, according to the invention, hereinafter referred to.

In the above-described resist-applicating and developing system, an untreated wafer W is transferred by the arm 4 of the transfer unit 1 from the wafer carrier 2 onto the alignment stage 6, and is positioned thereon. Thereafter, the wafer W on the stage 6 is transferred to the treatment devices 14–18 by the main arm 13 of the transfer device 12. During the transfer, the wafer W is subjected to resist-applicating and developing treatments. The treated wafer W is returned to the alignment stage 6 by the main arm 13, and transferred to the wafer carrier 3 by the arm 4.

Then, the developer device 17 will be explained in detail.

As is shown in FIG. 1, the device 17 has a spin chuck 20 movable vertically and horizontally and disposed to draw and hold the wafer W, and a developer-supply nozzle 21 movable upwards for supplying from above a developer liquid, as a treatment liquid, onto the wafer W. A holder 23 is provided on one side of the chuck 20 for holding the developer-supply nozzle 21 when the nozzle is not used. A rinse-supply nozzle 24 is provided on the other side of the chuck 20 for rinsing the wafer W after the developing treatment. The developer-supply nozzle 21 is transferred by a nozzle-moving member 25 between the spin chuck 20 and holder 23. The rinse-supply nozzle 24 is rotated to shift between a waiting position (as shown in FIG. 1) and a position above the chuck 20.

As is shown in FIGS. 2–5, the developer-supply nozzle 21 has a rectangular vessel 26 having a length substantially equal to the diameter of the wafer W. A projection 27 and a nozzle tip 27a project from the bottom of the vessel 26 and extend in the longitudinal direction thereof (i.e., in a direction perpendicular to the sheet of FIG. 2). The projection 27 and nozzle tip 27a are shown in FIG. 6 in detail. A plurality of thin through holes 22 are formed in the projection 27 and tip 27a in the longitudinal direction at regular intervals.

Figure 2:
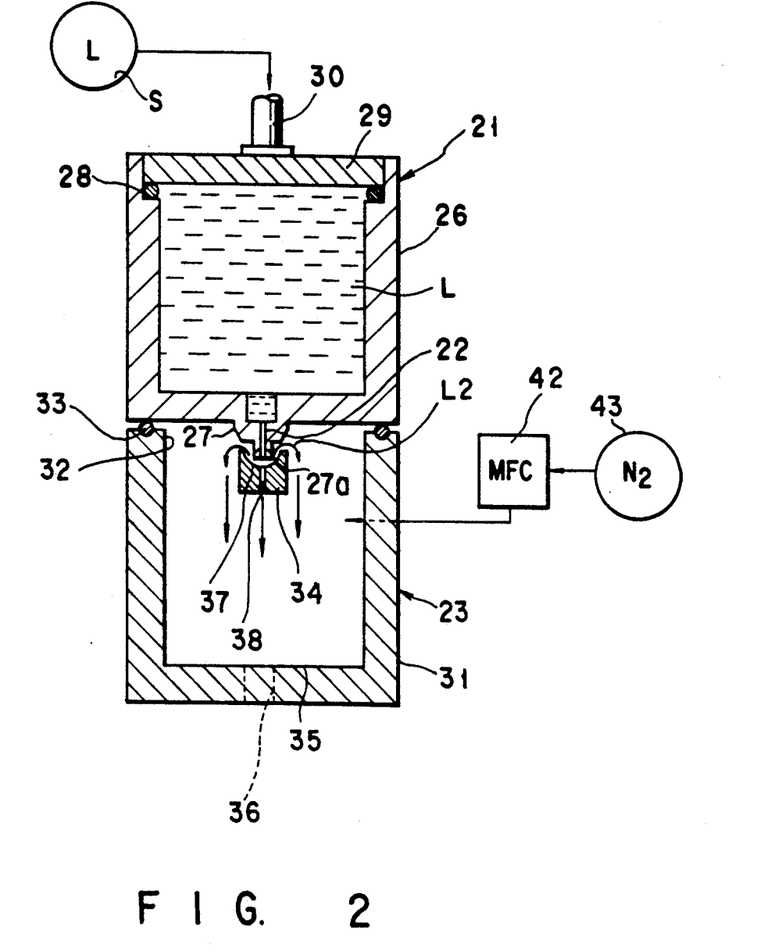
FIG. 2 is a cross-sectional view, showing an essential part of a liquid-supply apparatus according to a first embodiment of the invention.

An openable cap member 29 is provided on an upper portion of the rectangular vessel 26 and closes the vessel 26 in an airtight manner with the use of an O-ring 28. A treatment-liquid supply pipe 30 is connected to the cap member 29, and a developer liquid L can be supplied under a predetermined pressure from a developer-supply source S into the vessel 26, together with a gas such as an active gas.

Figure 4:
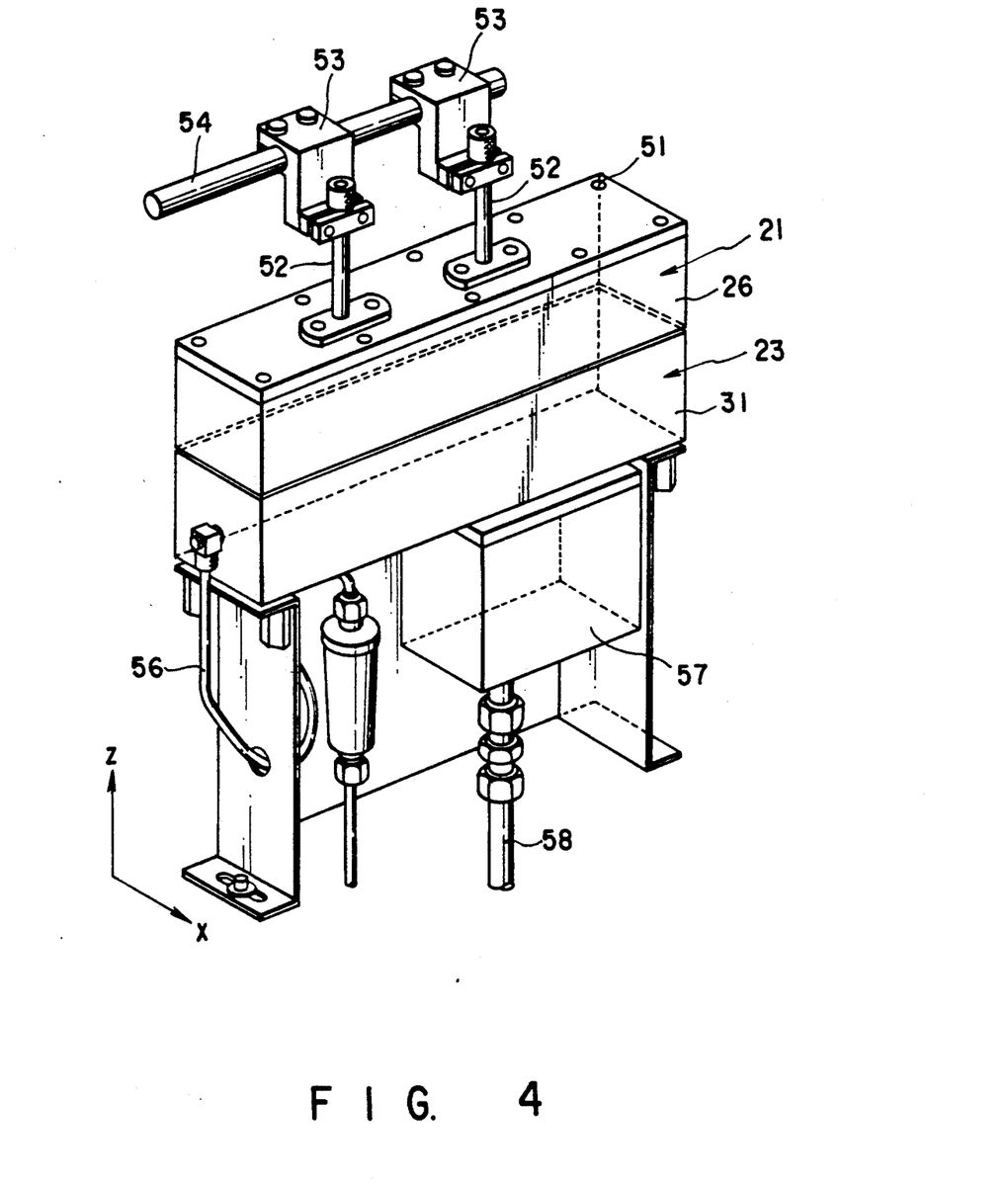
FIG. 4 is a perspective view, showing an essential part of the liquid-supply apparatus of the first embodiment.

As is shown in FIG. 4, the openable cap member 29 is screwed to the vessel 26 by means of screws 51. The vessel 26 is coupled with a pair of support rods 52 by means of the cap member 29. The support rods 52 are secured to a shaft 54 by means of connectors 53. The shaft 54 is driven by the nozzle-moving member 25 in the vertical and horizontal directions (i.e., in the Z and X directions in FIG. 4). A line 56 communicating with a nytrogen-supply source 43 is connected to a side portion of a casing 31. A drain trap 57 is provided on the lower surface of the casing 31, and connected to a drain port 36 of the casing 31 and also to a drain line 58.

As is shown in FIGS. 2–5, the nozzle-holding casing 31 of the holder 23 of the first embodiment is shaped like a box and holds the developer-supply nozzle 21 such that the through holes 22 are not sealed. An O-ring 33 is provided on an upper portion of the casing 31, and contacts the supply nozzle 21 in an airtight manner when the nozzle is held by the casing 31. The casing 31 has a tapered bottom 35, and the drain port 36 is formed in a lowermost portion of the bottom 35.

The casing 31 has an upper opening 32. In a middle portion of the opening 32, a conduit 34 having a groove 37 with a U-shaped cross section extends in the longitudinal direction of the nozzle tip 27a. The conduit 34 extends in the longitudinal direction of the casing 31, and has both opposite ends secured to both opposite walls of the same, respectively. The groove 37 has a size such that the bottom and side portions thereof are separate by about 2 mm from opposite surfaces of the nozzle tip 27a. The conduit 34 is provided at the bottom 37a with a plurality of small through holes 38 having a diameter such as 1 mm and formed at regular intervals such as 10 mm in the longitudinal direction of the conduit 34.

Figure 3:
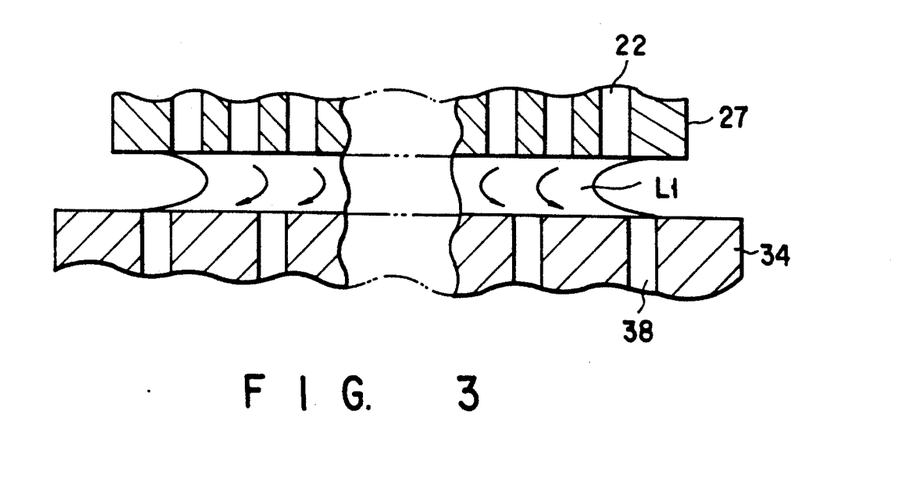
FIG. 3 is a cross-sectional view, showing a state in which a developer liquid moves from the end of a nozzle tip to the bottom of a vessel.

Thus, in a state in which the holder 23 holds the nozzle 21, drops of developer liquid from the through holes 22 stick to that inner surface of the conduit 34 which faces the nozzle tip 27a with a fine clearance therebetween, and are drawn to the bottom of the conduit 34 as a result of capillary phenomenon. That part of the developer liquid which remains at the inlets of the through holes 22 is pulled by the other part drawn to the conduit 34, and removed from the through holes 22. The liquid is then exhausted through the through holes 38. This being so, drops of developer liquid are prevented from remaining on the periphery of the nozzle tip 27a.

The casing 31 is connected via an MFC 42 to an inactive gas (e.g. nitrogen N2 gas) supply source 43. The inactive gas is guided into the casing 31 through a gas-supply port 44 formed therein and positioned slightly lower than the conduit 34. The inactive gas is continuously supplied so as to make pressure in the casing 31 to a positive value, thereby preventing deterioration of the developer liquid existing in the through holes 22.

The wafer W is treated in the developing device, after a resist film is applied onto the wafer W in the device 18 and then exposed by an exposure system (not shown) located adjacent to the device 18. The developer liquid is supplied into the rectangular vessel 26 of the supply nozzle 21 before it is applied to the wafer W. The supply nozzle 21 waits in the holder 23 where the vessel 26 is filled with the developer liquid L. The wafer W is transferred onto the spin chuck 20 by the arm 13, and the chuck 20 is moved downward.

Figure 6:
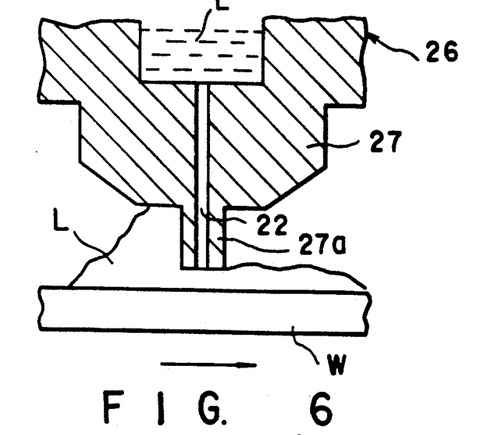
FIG. 6 is a cross sectional view, showing a manner for spreading the developer liquid on a wafer by means of a nozzle tip.
Figure 7A:
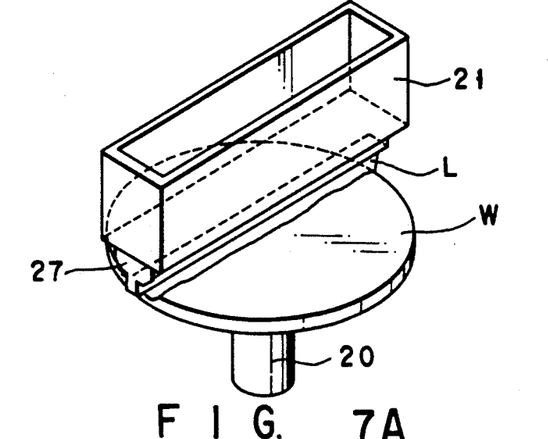
FIGS. 7A and 7B are perspective views, showing how to spread the developer liquid on the wafer by the nozzle tip.
Figure 7B:
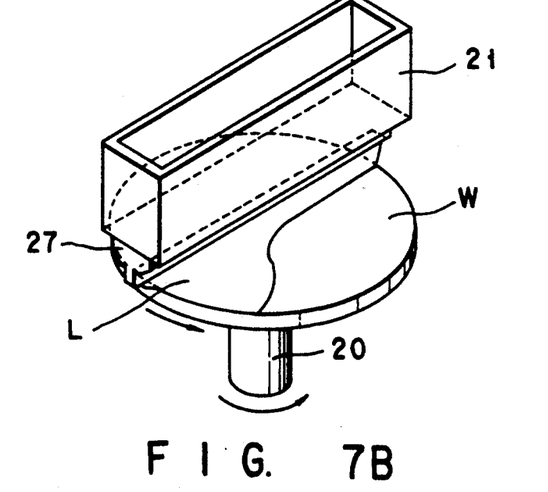

Thereafter, the nozzle-moving member 25 moves the developer-supply nozzle 21 toward the center of the wafer W in the horizontal direction. The spin chuck 20 and nozzle 21 are moved so that the distance between the nozzle tip 27a of the nozzle 21 and wafer W becomes 0.8 mm–2.0 mm. In this state, a developer liquid of a predetermined pressure is supplied from the supply pipe 30 into the rectangular vessel 26, and is oozed through the through holes 22 onto the wafer W in the shape of a stripe. At this time, the chuck 20 is rotated more than 180° at low speed, thereby spreading the oozed liquid (see FIGS. 6, 7A, and 7B). Accordingly, the developer liquid is applied uniformly thinly onto the wafer W, and the resist film is developed for e.g. 30 seconds.

The nozzle 21 is then retreated by the nozzle-moving member 25 from the position above the wafer W. Then, it is horizontally moved to a position above the casing 31 of the holder 23, and down to the casing 31.

On the other hand, after the nozzle 21 is retreated and the resist development is finished, the spin chuck 20 is rotated at high speed, thereby eliminating unnecessary part of the developer liquid on the wafer W. While the nozzle 21 is held by the holder 23, i.e., while it is in the waiting state, the rinse-supply nozzle 24 is rotated and moved to a position above the wafer W, thereby applying a rinsing liquid (e.g. pure water) to the wafer W. After having rinsed the wafer W, the spin chuck 20 is rotated at high speed again, thereby eliminating the rinsing liquid. This is the completion of one cycle of the developing treatment, and the wafer W is unloaded from the spin chuck 20.

While the nozzle 21 is held by the holder 23, the distal end of the nozzle tip 27a of the nozzle 21 is surrounded by the conduit 34. In this state, the developer liquid hanging from the through holes 22 is drawn to the conduit 34 as a result of capillary phenomenon, and is exhausted from the same. Further, degradation of the developer liquid remaining in the through holes 22 is prevented by virtue of the nitrogen atmosphere in the casing 31. The nozzle tip 27a is promptly dried in the nitrogen atmosphere.

In addition, after the nozzle 21 performs the supply treatment a predetermined number of times, i.e., the developer liquid is applied onto a plurality of wafers, or when the device is not used for a long time, dummy dispensation is performed. In this dummy dispensation, a predetermined amount of developer liquid is exhausted from the through holes 22 in a state where the nozzle tip 27a is surrounded by the conduit 34. As a result, the developer liquid which deteriorated and remains at the inlets of the through holes 22 is exhausted. Further, at this time, the exhausted developer liquid overflows out of the conduit 34, as is indicated by L2 in FIG. 2, thereby cleaning the side portions of the nozzle tip 27a. At the side portions of the nozzle tip 27a, it is liable to cause particles due to the developer liquid adhered thereto and solidified, when, for example, the developer liquid is spread over the wafer W as shown in FIG. 6. Such particles can be cleared away by the dummy dispensation.

Figure 8:
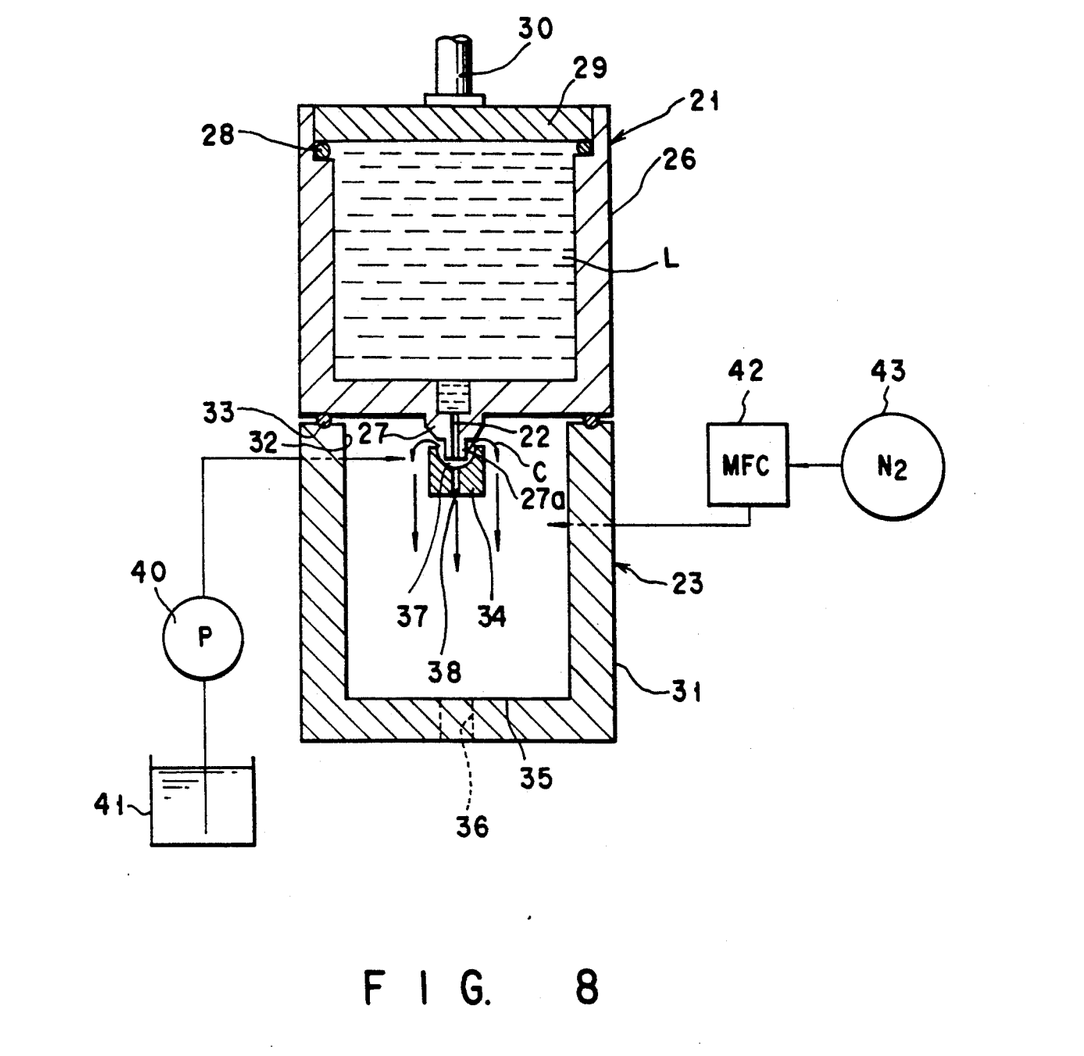
FIG. 8 is a cross sectional view, showing an essential part of a liquid-supply apparatus according to a second embodiment of the invention.

FIG. 8 shows a holder for holding a retreated nozzle, according to a second embodiment of the invention. In the figure, reference numerals corresponding to those in FIGS. 2–5 directed to the first embodiment denote corresponding elements, and explanation thereof is omitted.

Figure 5:
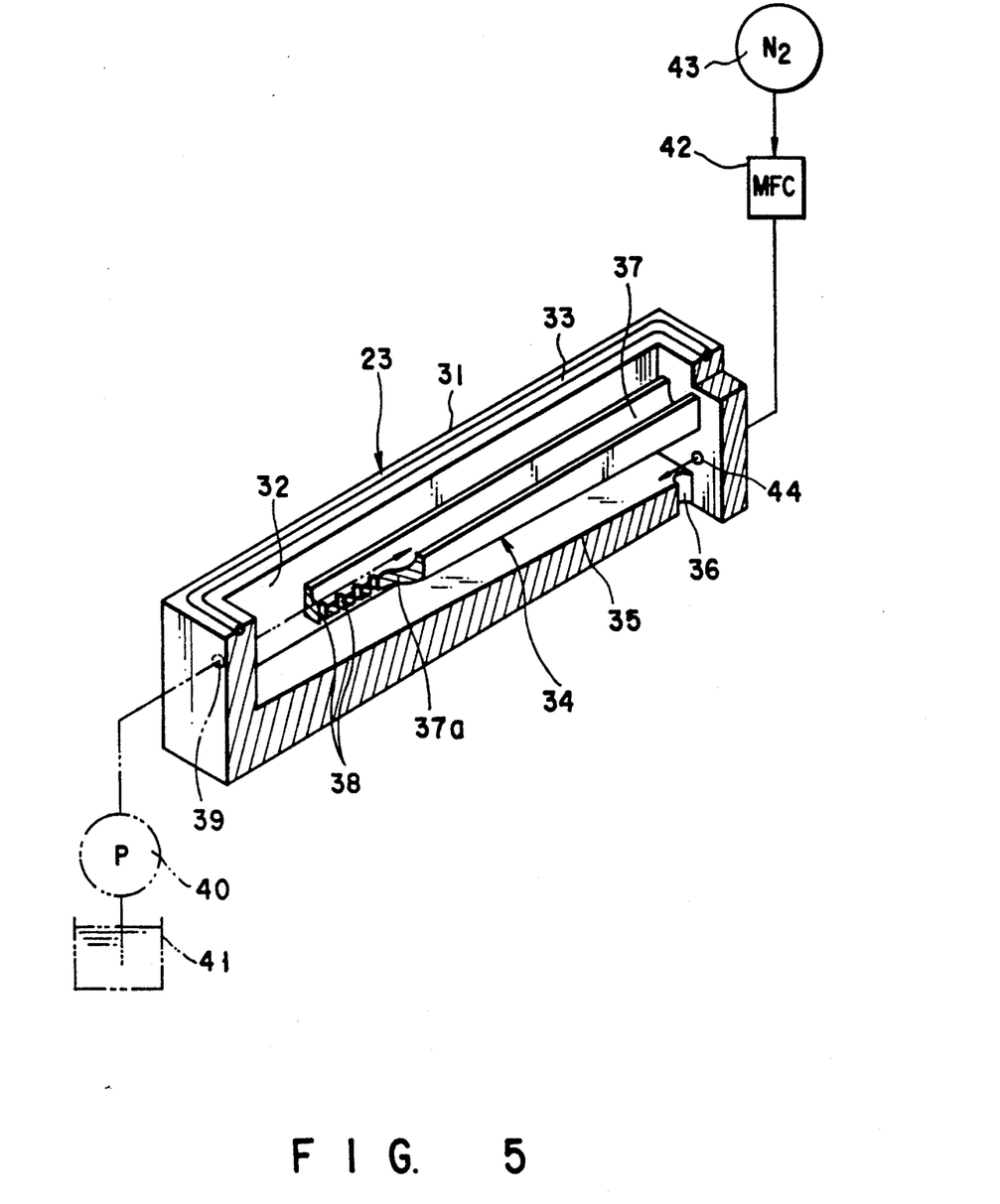
FIG. 5 is a perspective view partly in section, showing a holder for holding a retreated nozzle, according to the first embodiment of the invention.

In the second embodiment, particular means for cleaning the nozzle tip 27a is provided for the conduit 34, and is indicated by the imaginary line in FIG. 5 for easy understanding.

The cleaning means has a tank 41, for containing a cleaning liquid (e.g. pure water), connected to the casing 31 via a pump 40. The cleaning liquid is applied onto the conduit 34 through a supply inlet 39 opening to the side wall of the casing 31.

When the cleaning liquid is supplied from the tank 41 to the conduit 34 with the nozzle 21 held by the holder 23, it flows through the conduit 34 in the longitudinal direction thereof, and also overflows out of the side portions of the conduit 34, as is indicated by C in FIG. 8. As a result, the developer liquid which deteriorated an solidified is cleared from the inlets of the through holes 22, and the side portions of the nozzle tip 27a are cleaned. The cleaning liquid and removed developer liquid flow to the tapered bottom 35 of the casing 31 through the through holes 38 of the conduit 34, and are exhausted from the drain port 36. The cleaned nozzle tip 27a is dried by nitrogen gas supplied through the opening 44.

Figure 9:
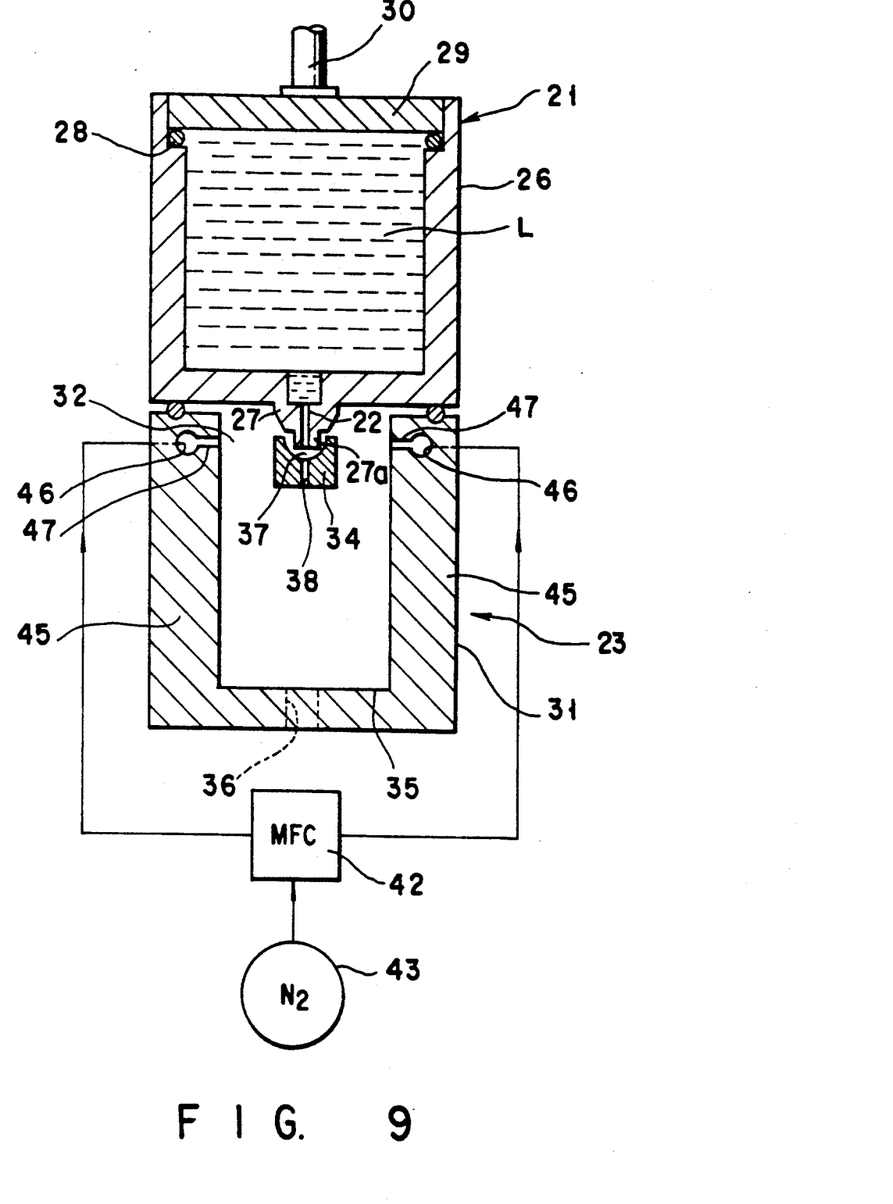
FIG. 9 is a cross sectional view, showing an essential part of a liquid-supply apparatus according to a third embodiment of the invention.

FIG. 9 shows a holder for holding a retreated nozzle, according to a third embodiment of the invention. In the figure, reference numerals corresponding to those in FIGS. 2–5 directed to the first embodiment denote corresponding elements, and explanation thereof is omitted.

In the third embodiment, nitrogen gas is supplied from a position of substantially the same level as the upper portion of the conduit 34 in a direction perpendicular to the longitudinal direction of the casing 31. Gas passages 46 are formed through longitudinal side walls 45 of the casing 31, respectively, and a plurality of gas supply ports 47 opening from the gas passages 46 to the side portions of the conduit 34 are formed in each of the walls 45 at regular intervals. This structure enables nitrogen gas to be supplied uniformly to the entire nozzle tip 27a, thereby preventing deterioration of the liquid remaining in the through holes 22. If the holder of the third embodiment is combined with the nozzle tip cleaning means shown in FIG. 8, the nozzle tip 27a can be dried uniformly and promptly. Though in this embodiment, the gas supply ports 47 are provided on both sides of the conduit 34, they may be provided only on one side thereof.

Figure 10:
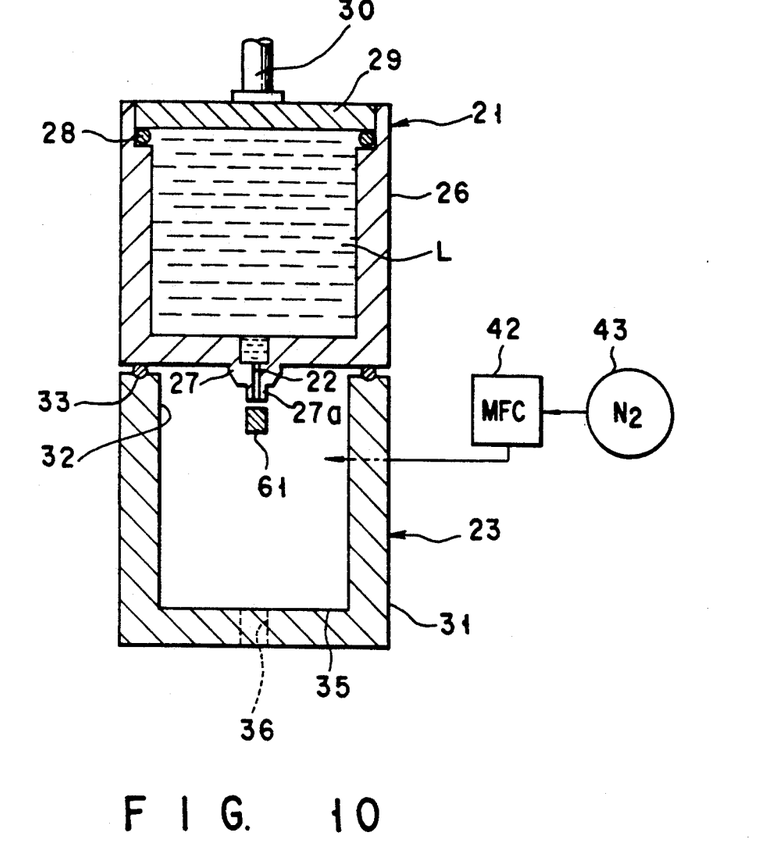
FIG. 10 is a cross sectional view, showing an essential part of a liquid-supply apparatus according to a fourth embodiment of the invention.
Figure 11:
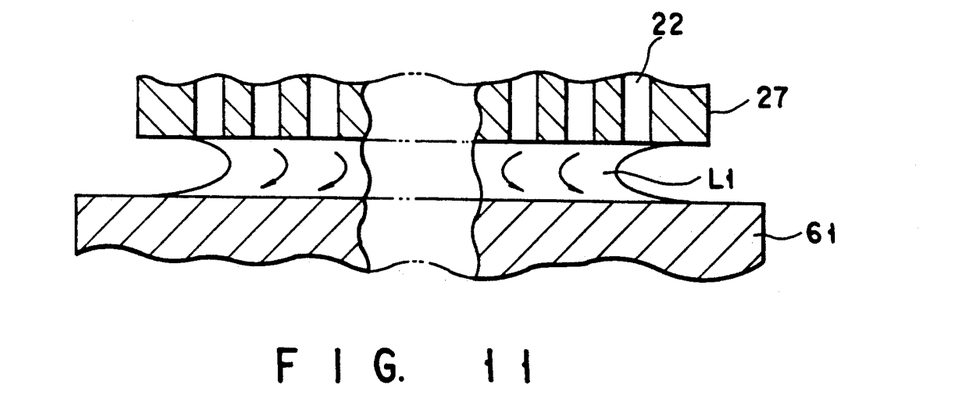
FIG. 11 is a cross sectional view, showing a state in which the developer liquid moves from the end of the nozzle tip to a bar member.
Figure 12:
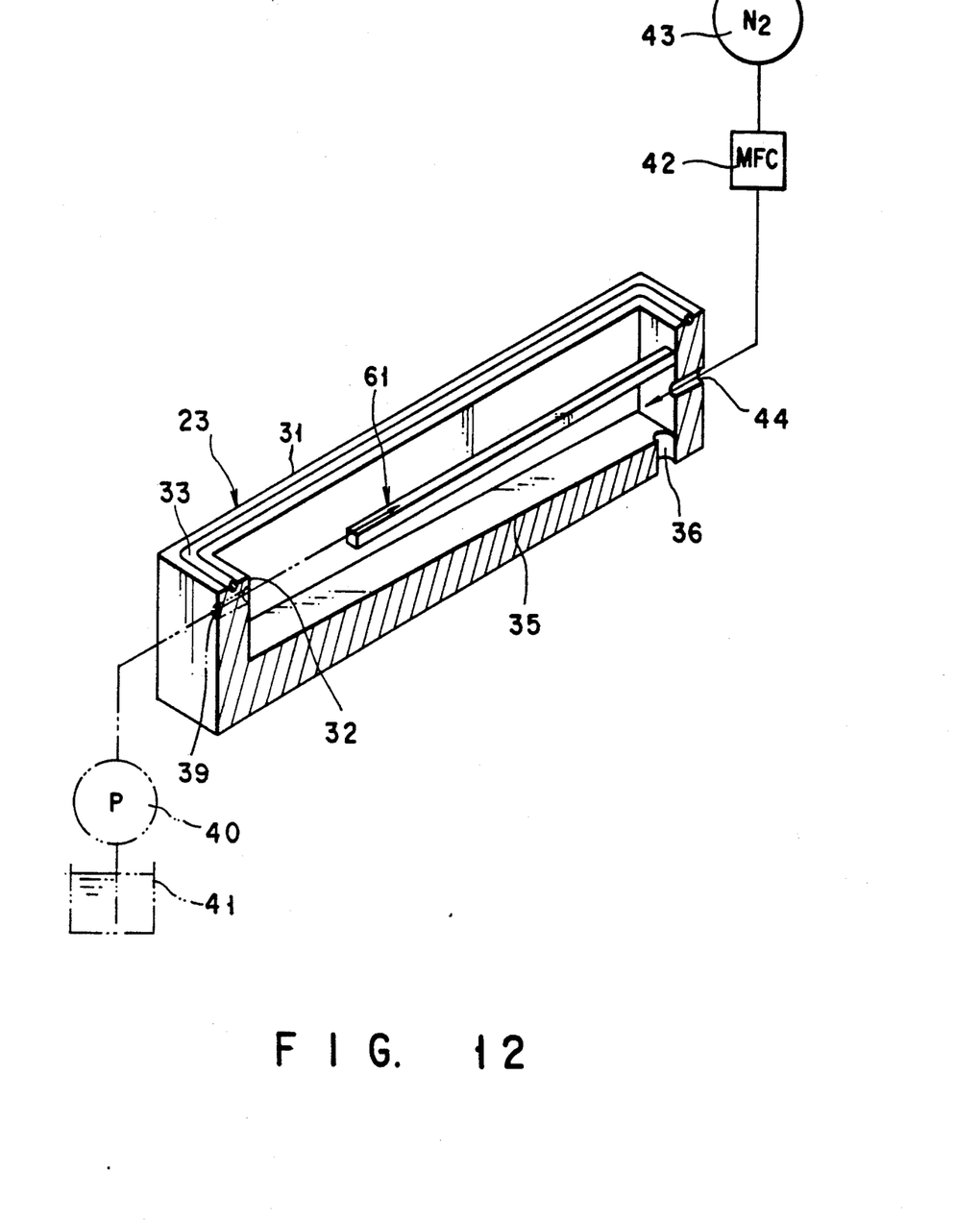
FIG. 12 is a perspective view partly in section, showing a holder for holding a retreated nozzle, according to the fourth embodiment of the invention.

FIGS. 10-12 show a holder for holding a retreated nozzle, according to a fourth embodiment of the invention. In the figures, reference numerals corresponding to those in FIGS. 2-5 directed to the first embodiment denote corresponding elements, and explanation thereof is omitted.

In the fourth embodiment, the member for removing the developer liquid hanging from the nozzle tip 27a comprises a rectangular bar 61 located opposed to the end of the tip 27a. The bar 61 is provided in the longitudinal direction of the casing 31, and has both opposite ends supported by both opposite end walls of the casing 31. A clearance of about 1-2 mm is defined between the lower end of the nozzle tip 27a and the upper surface of the bar 61.

Thus, in a state in which the holder 23 holds the nozzle 21, the developer liquid hanging from the through holes 22 sticks to the upper surface of the bar 61 spaced from the nozzle tip 27a by a fine clearance, and is drawn to the bar 61 as a result of capillary phenomenon, as indicated by L1 in FIG. 11. Further, that part of the developer liquid which remains at the inlets of the through holes 22 is pulled by the drawn part of the developer liquid, and removed from the through holes 22. The developer liquid which drops onto the bar 61 flows along the side surfaces of the bar 61, thus being removed. The developer liquid is prevented from remaining in the through holes 22 in the shape of drops.

Like the first through third embodiments, an inactive gas such as nitrogen gas is supplied form the gas supply source 43 into the casing 31. The atmosphere of nitrogen prevents the developer liquid remaining in the through holes 22 from degrading, and also allows the nozzle tip 27a to be dried promptly.

Moreover, as is indicated the imaginary line in FIG. 12, cleaning means similar to that employed in the second embodiment may be incorporated in the fourth embodiment. This cleaning means can clear the developer liquid from the bar 61, using a cleaning liquid (e.g., pure water) supplied from the tank 41. The used cleaning liquid and unnecessary developer liquid are exhausted through the tapered bottom 35 and drain port 36.

Figures 13, 14, 15:
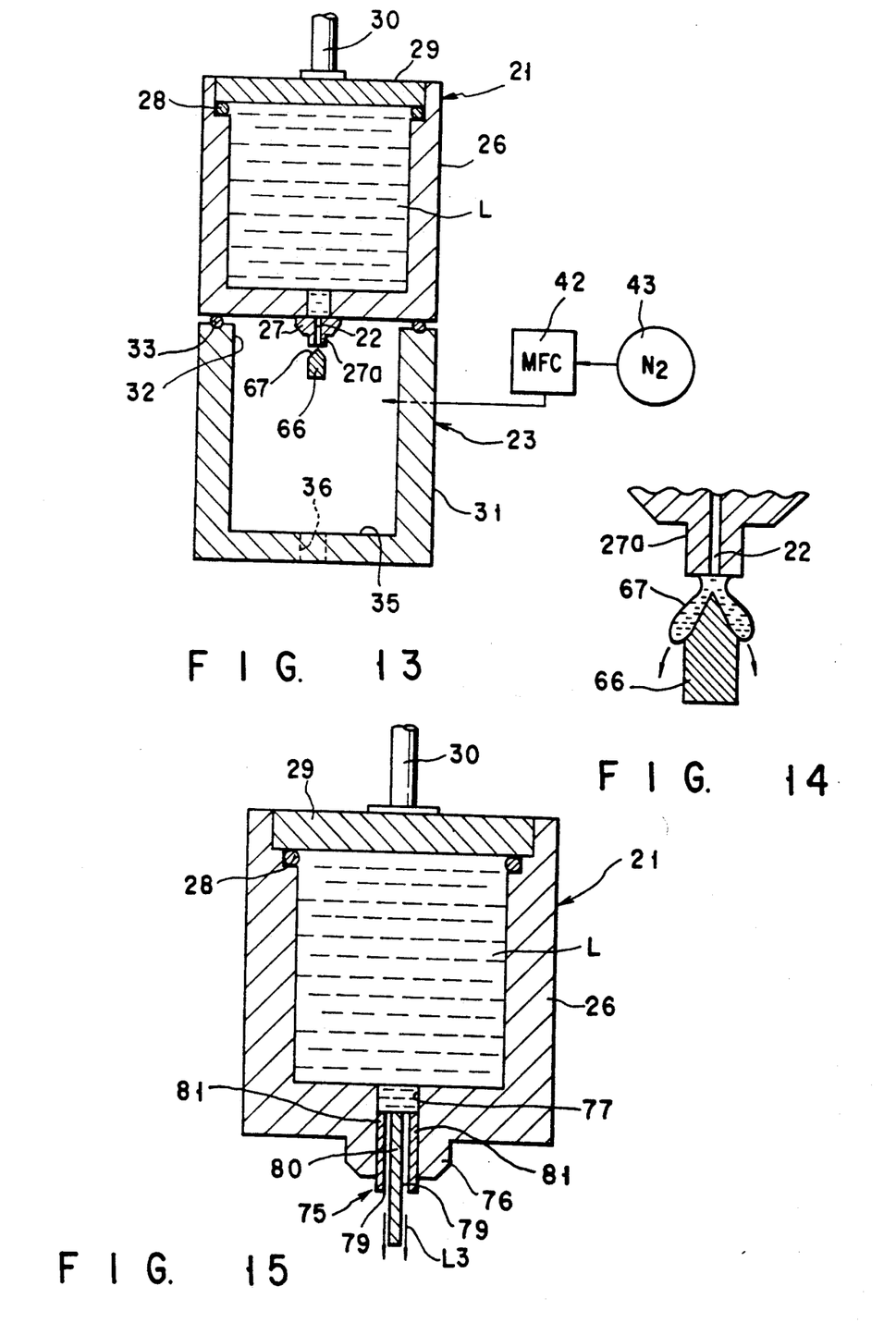
FIG. 13 is a cross sectional view, showing an essential part of a liquid-supply apparatus according to a fifth embodiment of the invention.
FIG. 14 is a cross sectional view, showing a state in which the developer liquid moves from the end of the nozzle tip to a bar member.
FIG. 15 is a cross sectional view, showing a supply nozzle according to a sixth embodiment of the invention.

FIGS. 13 and 14 show a holder for holding a retreated nozzle, according to a fifth embodiment of the invention. In the figures, reference numerals corresponding to those in FIGS. 2-5 directed to the first embodiment denote corresponding elements, and explanation thereof is omitted.

In the fifth embodiment, a bar 66 for removing the developer liquid hanging from the nozzle tip 27a has a sharp angular portion 67 located opposed to the through holes 22. The top of the angular portion 67 faces the lower end of the nozzle tip 27a with a fine clearance of 1-2 mm interposed therebetween. The other structural elements in the fifth embodiment are similar to those in the fourth embodiment.

By virtue of the liquid-cutting angular portion 67 of the bar 66, the developer liquid can easily and promptly drop downward. Specifically, as is shown in FIG. 14, the developer liquid hanging from the nozzle tip 27a and remaining at the inlets of the through holes 22 moves to the bar 66 due to capillary phenomenon, and is then divided into two parts along the inclined surfaces of the angular portion 67. The divided parts are pulled downward. Thus, the developer liquid can be prevented from remaining on the bar 66 and again sticking to the nozzle tip 27a.

Unlike the first embodiment, the side portions of the nozzle tip 27a cannot be cleaned by dummy dispensation in the fourth and fifth embodiments shown in FIGS. 10-14. Then, an improved nozzle which can be effectively combined with the holder of the fourth or fifth embodiment will be explained.

Figure 16:
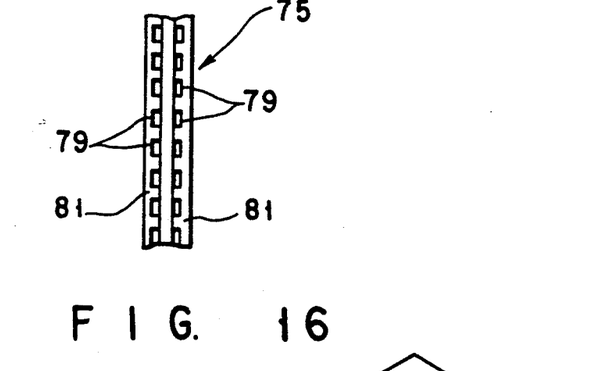
FIG. 16 is a bottom view, showing the nozzle tip of the supply nozzle according to the sixth embodiment of the invention.
Figure 17:
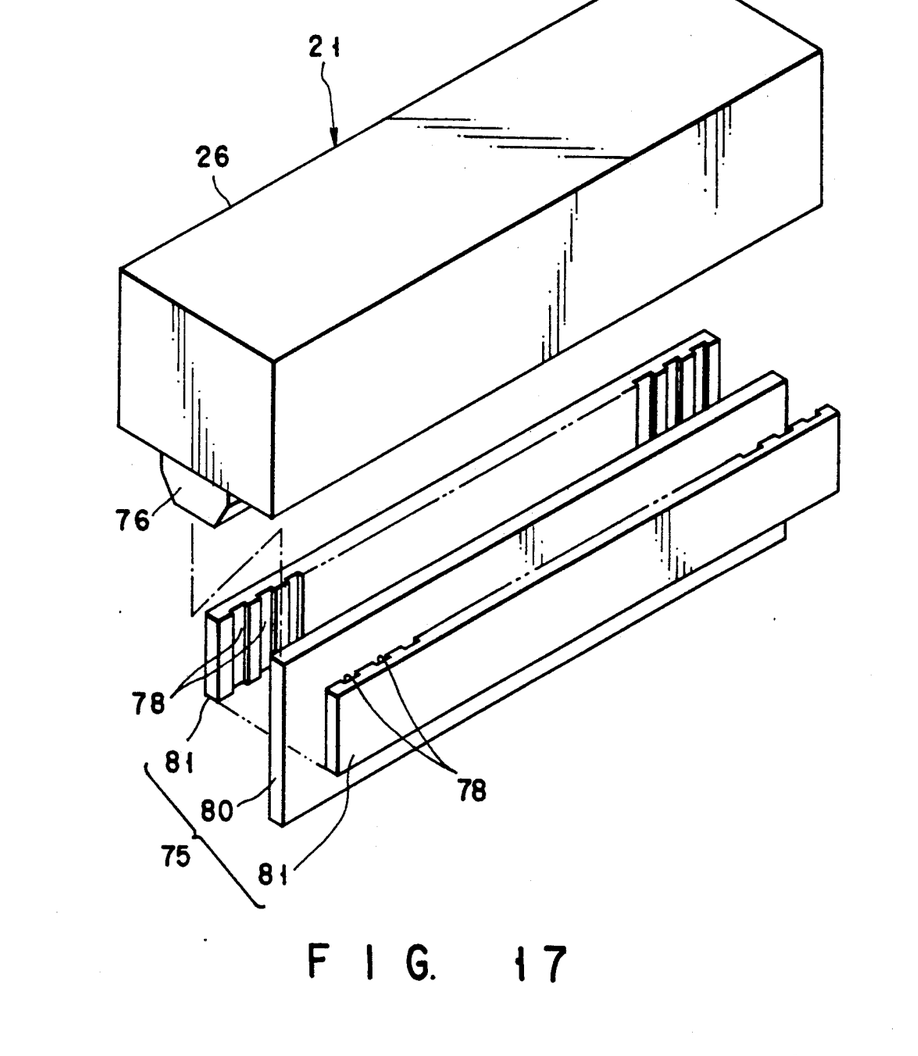
FIG. 17 is an exploded perspective view, showing the supply nozzle of the sixth embodiment.

FIGS. 15-17 show a developer-supply nozzle according to a sixth embodiment of the invention. In the figures, reference numerals corresponding to those in FIGS. 1-14 directed to the first through fifth embodiments denote corresponding elements, and explanation thereof is omitted.

In the sixth embodiment, a projection 76 extends on the bottom of the rectangular vessel 26 of the nozzle 21 in the longitudinal direction of the bottom, as is shown in FIG. 15. In a passage 77 formed in the projection 76 and vessel 26, a nozzle tip 75 is provided in a fluid-tight manner. The tip 75 consists of a central plate 80 and two side plates 81 constructed in the following manner.

As is shown in FIG. 15, the central plate 80 and side plates 81 have different lengths. About a half portion of the plate 80 projects from the projection 76, and the side plates 81 slightly project from the projection 76. These central and side plates are stuck together by an adhesive or the like or secured to one another by a screw member, in a fluid-tight manner. A plurality of grooves 78 having a rectangular cross section are formed in that surface of each side plate 81 which faces the central plate 80, as is shown in FIG. 17. Thus, a plurality of through holes 79 are defined between the plates 80 and 81 where these plates are assembled. The plates 80 and 81 consist of plate members made of hard chloroethylene such CPVC having a corrosion resistance. The plate 80 projects from the plates 81 by, for example, about 4-5 mm. The shape of the cross section of the groove 78 is not limited to a rectangle, but may be a circular arc, etc.

Figure 20:
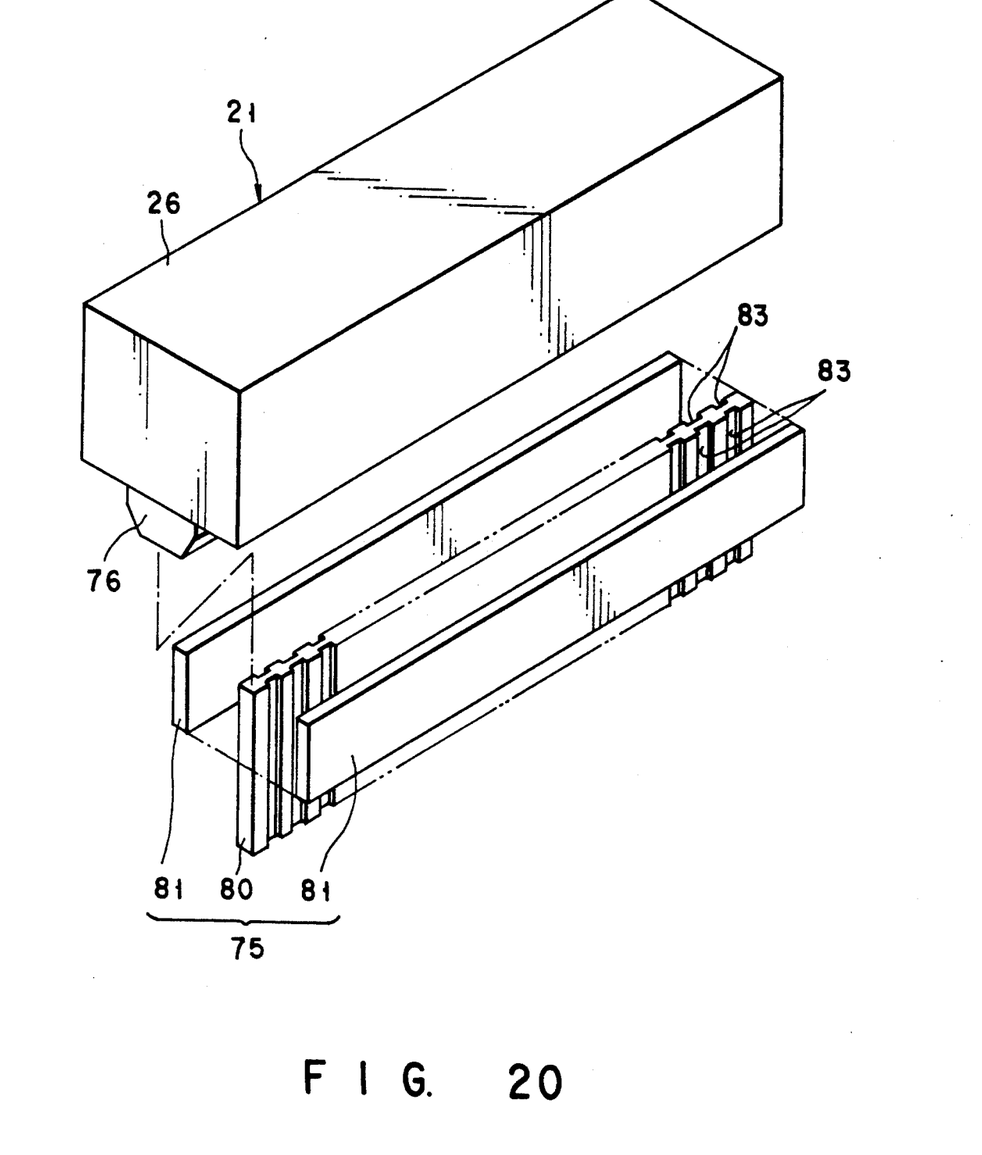
FIG. 20 is an exploded perspective view, showing the supply nozzle of the seventh embodiment.

With the above structure, the developer liquid L contained in the rectangular vessel 26 flows through the through holes 79 defined on both sides of the central plate 80, and is supplied onto the wafer W drop by drop. Further, as is shown in FIG. 20, when the developer liquid L is spread on the wafer W, the side surfaces of the central plate 80 serves as a spatula.

In a case where the nozzle 21 of the sixth embodiment is combined with the holder 23 shown in FIG. 10 or 13, the clearance between the lower end of the central plate 80 and the bar 6 or 66 is set to a size falling within the above-described range. The developer liquid hanging from the central plate 80 is removed by the bar 61 or 66. If the developer liquid sticks to the side surface of the plate 80 and degrades, it can be cleared by the above-described dummy dispensation. That is, occurrence of particles of the developer liquid on the side surfaces of the plate 80 can be avoided by flowing fresh developer liquid along the side surfaces as indicated by the arrows L3 in FIG. 15.

Figures 18, 19:
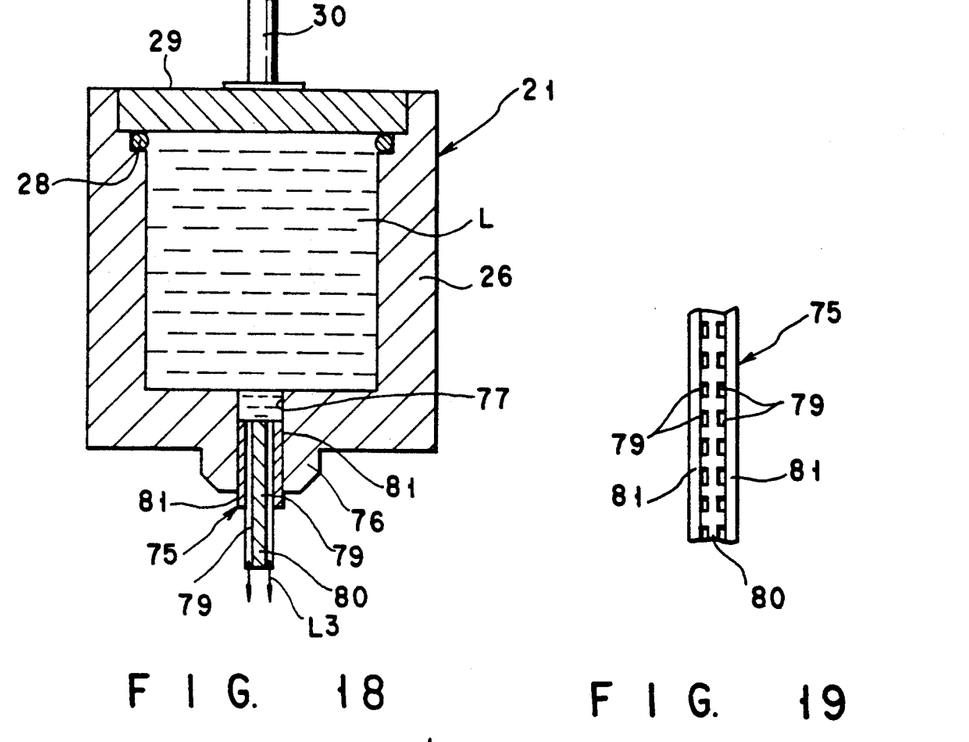
FIG. 18 is a cross sectional view, showing a supply nozzle according to a seventh embodiment of the invention.
FIG. 19 is a bottom view, showing the nozzle tip of the supply nozzle according to the seventh embodiment of the invention.

Although in the sixth embodiment, the holes 79 are formed by the grooves 78 in the side plates 81, they can be formed in a different manner. FIGS. 18-20 show a nozzle according to a seventh embodiment of the invention. In the figures, reference numerals corresponding to those in FIGS. 15-17 directed to the sixth embodiment denote corresponding elements, and explanation thereof is omitted.

In the seventh embodiment, grooves 83 are formed at regular intervals in both opposite side surfaces of the central plate 80 facing the side plates 81. Thus, the through holes 79 are defined by the grooves 83 in a state where the plates 80 and 81 are assembled. Alternatively, the holes 79 may be defined by forming grooves in both of the side plates 81 and the central plate 80.

Figure 21:
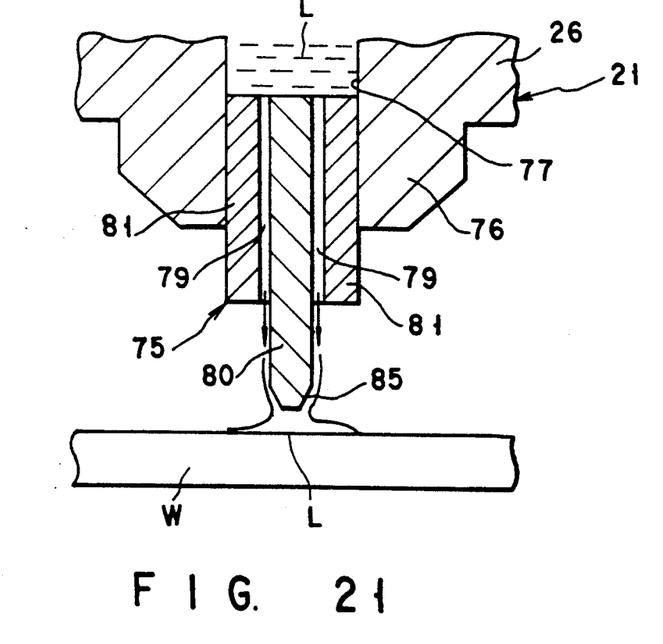
FIG. 21 is a cross sectional view, showing the nozzle tip of a supply nozzle according to an eighth embodiment of the invention.

FIG. 21 shows a nozzle tip according to a eighth embodiment of the invention. In the figure, reference numerals corresponding to those in FIGS. 15-17 directed to the sixth embodiment denote corresponding elements, and explanation thereof is omitted.

In the sixth and seventh embodiments, the central plate 80 has an uniform thickness, whereas in this embodiment, the central plate 80 has a tapered end portion with opposite inclined surfaces 85. By virtue of the inclined surfaces 85 provided for guiding the developer liquid, the liquid can be effectively guided onto the wafer W, and can be cut easily. Accordingly, the liquid can be prevented from remaining on the side surfaces of the central plate 80, thereby minimizing occurrence of particles. Although the grooves defining through holes 79 are formed in the side plats 81 in FIG. 21, the grooves may be formed in the central plate 80 instead.

The invention is applicable to coating an object with an etching liquid or a magnetic liquid, as well as with the developer liquid. Moreover, the invention is applicable to an apparatus for supplying a treatment liquid to an object such as an LCD substrate, a glass substrate, or a printed board, as well as the above-described semiconductor wafer.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A liquid-supply apparatus comprising:
   a table for supporting a substrate to be treated;
   a vessel defining a space for containing treatment liquid;
   a treatment liquid contained in the space;
   a supply nozzle having a nozzle tip with a plurality of through holes communicating with the space and arranged in line;
   means for controlling discharge of the treatment liquid through the through holes and stop of the discharge, the treatment liquid forming drops hanging from the nozzle tip when the discharge is stopped;
   a holding member provided on one side of the table for allowing the supply nozzle to wait therein;
   a removal member for removing the developer liquid in a state in which the supply nozzle is held by the holding member, the removal member having a surface opposed to the nozzle tip along the line of the through holes, the distance between the nozzle tip and the opposed surface being smaller than the length of each drop of the developer liquid; and
   transfer means for transferring the supply nozzle between a supply position above the table and a waiting position on the holding member.

2. The apparatus according to claim 1, wherein the holding member has a housing for defining a substantially closed space together with the supply nozzle when it holds the nozzle.

3. The apparatus according to claim 2, further comprising means for supplying an inactive gas into the closed space.

4. The apparatus according to claim 3, wherein the means for supplying an inactive-gas has a nitrogen-gas supply line connected to the housing.

5. The apparatus according to claim 1, wherein the removal member has an U-shaped conduit extending along the line of the through holes and surrounding the nozzle tip, the bottom of the conduit defining the opposed surface.

6. The apparatus according to claim 5, wherein the bottom of the conduit has a plurality of through holes along the line of the through holes of the nozzle tip.

7. The apparatus according to claim 5, further comprising means for supplying a cleaning liquid to the conduit.

8. The apparatus according to claim 1, wherein the removal member has a bar member extending along the line of the through holes, the upper surface of the bar member defining the opposed surface.

9. The liquid-supply apparatus according to claim 8, wherein the bar has a upper end portion defined by two side surfaces diverging downward.

10. The liquid-supply apparatus according to claim 8, further comprising means for supplying a cleaning liquid onto the bar member.

11. A liquid-supply apparatus comprising:
    a table for supporting a substrate to be treated;
    a vessel defining a space for containing treatment liquid;
    a treatment liquid contained in the space;
    a supply nozzle having a nozzle tip with a plurality of through holes communicating with the containing space, the nozzle tip having two lines of the through holes, and a central plate arranged between the two lines of the through holes and projecting from the lower ends of the through holes;
    means for controlling discharge of the treatment liquid through the through holes and stop of the discharge, the treatment liquid forming drops hanging from the nozzle tip when the discharge is stopped;
    a holding member provided on one side of the table for allowing the supply nozzle to wait therein;
    a removal member for removing the developer liquid in a state in which the supply nozzle is held by the holding member, the removal member having a surface opposed to the nozzle tip along the lines of the through holes the distance between the nozzle tip and the opposed surface being smaller than the length of each drop of the developer liquid; and
    transfer means for transferring the supply nozzle between a supply position above the table and a waiting position on the holding member.

12. The apparatus according to claim 11, wherein the central plate has a tapered lower end portion having opposite inclined surfaces.

13. The apparatus according to claim 11, wherein the nozzle tip further has two side plates located on both opposite sides of the central plate, respectively, and the through holes are provided between the central plate and each of the side plates.

14. The apparatus according to claim 13, wherein the side plates each have a plurality of grooves, and the grooves and central plate define the through holes.

15. The apparatus according to claim 13, wherein the central plate has a plurality of grooves, and the grooves and side plates define the through holes.

16. The apparatus according to claim 13, wherein the vessel has a lower portion with an opening communicating with the space, and the central and side plates are mounted in the opening in a fluid-tight manner.

* * * * *